US012795968B2

(12) United States Patent
Torres Alonso

(10) Patent No.: US 12,795,968 B2
(45) Date of Patent: Nov. 10, 2026

(54) GRAPHENE DEVICE AND METHOD OF METALLIZING A GRAPHENE DEVICE

(71) Applicant: Graphenea Semiconductor S.L.U., Donostia—San Sebastián (ES)

(72) Inventor: Elías Torres Alonso, Donostia—San Sebastián (ES)

(73) Assignee: GRAPHENEA SEMICONDUCTOR S.L.U., Donostia—San Sebastián (ES)

( * ) Notice: Subject to any disclaimer, the term of this patent is extended or adjusted under 35 U.S.C. 154(b) by 346 days.

(21) Appl. No.: 18/525,091

(22) Filed: Nov. 30, 2023

(65) Prior Publication Data

US 2024/0213350 A1 Jun. 27, 2024

(30) Foreign Application Priority Data

Dec. 23, 2022 (EP) .................................... 22383280

(51) Int. Cl.
*H10D 30/01* (2025.01)
*H10D 62/80* (2025.01)
*H10D 62/83* (2025.01)

(52) U.S. Cl.
CPC ......... *H10D 30/01* (2025.01); *H10D 62/8303* (2025.01); *H10D 62/882* (2025.01)

(58) Field of Classification Search
None
See application file for complete search history.

(56) References Cited

U.S. PATENT DOCUMENTS

2012/0132893 A1* 5/2012 Heo ........................ H10D 30/47 977/734
2013/0193411 A1 8/2013 Lee et al.

(Continued)

FOREIGN PATENT DOCUMENTS

WO 2019194713 A1 10/2019
WO 2022096640 A1 5/2022

OTHER PUBLICATIONS

Braun M. (2015) Magnetron Sputtering Technique. In: Nee A. (eds) Handbook of Manufacturing Engineering and Technology. Springer, London. pp. 2929-2957, https://doi.org/10.1007/978-1-4471-4670-4_28.

(Continued)

*Primary Examiner* — Michelle Mandala
(74) *Attorney, Agent, or Firm* — CANTOR COLBURN LLP

(57) ABSTRACT

A method of metallizing a solid-state device including a substrate and at least one graphene channel on the substrate includes applying a first metal deposition stage for depositing at least one first metallic structure, the metallic structure partially occupying the graphene layer and the substrate, wherein a metal deposition technique which does not use plasma is used to deposit the metallic structure; applying a second metal deposition stage for depositing at least one second metallic structure on a region of the first metallic structure not deposited on the graphene channel. A solid-state device includes at least two metallic structures, one partially occupying the graphene layer and the substrate and one partially deposited on a region of the at least one first metallic structure which is not deposited on the graphene channel. A method of packaging in a socket a die having at least one graphene-based solid-state device is related.

14 Claims, 11 Drawing Sheets

(56) References Cited

U.S. PATENT DOCUMENTS

| | | | | |
|---|---|---|---|---|
| 2014/0021446 | A1 | 1/2014 | Lee et al. | |
| 2014/0158988 | A1 * | 6/2014 | Chen .................. | H10D 30/6704<br>257/29 |
| 2017/0229587 | A1 * | 8/2017 | Lee .................... | H10D 30/6757 |
| 2020/0403068 | A1 * | 12/2020 | Thomas ................ | C01B 32/186 |

OTHER PUBLICATIONS

European Search Report for European Application No. 22383280.9, dated May 30, 2023, 5 pages.

Safarian, J., Engh, T.A. Vacuum Evaporation of Pure Metals. Metall Mater Trans A 44, 747-753 (2013). https://doi.org/10.1007/s11661-012-1464-2.

* cited by examiner

GRAPHENE DEVICE AND METHOD OF METALLIZING A GRAPHENE DEVICE

CROSS-REFERENCE TO RELATED APPLICATIONS

This application claims the benefit of European patent application 22383280.9, filed on 23 Dec. 2022, the disclosure of which is incorporated herein by reference in its entirety.

TECHNICAL FIELD

The present disclosure relates to the field of semiconductors and electronics industry and, in particular, to interconnections between a semiconductor device, such as an integrated circuit (IC), and its package, for later integration or assembly in, for example, a printed circuit board (PCB). More particularly, it relates to methods of metallising semiconductor devices comprising graphene. The applied metallization enables the subsequent interconnection between the semiconductor device and its package.

BACKGROUND

In the semiconductor and electronics industry sector, an IC, typically built in a chip or die, is usually assembled in a package for its later integration in a PCB. The current trend moves towards the miniaturizing of components and packages while their functionality is increased. Consequently, high-density packages are the more and more demanded, which challenges the assembly process of the packages to, for example, PCBs. The demand for high-density packages also challenges the process of connecting the IC to the external contacts of the package.

Wire bonding is a technology for making interconnections between an IC (or, in general, a semiconductor device) and its package during the fabrication of the semiconductor device. Wire bonding can also be used to connect an IC to other electronics or to connect from one PCB to another. Due to its cost-effectiveness and flexibility, wire bonding is used to assemble a vast majority of semiconductor packages. The wire bonding method consists of creating very thin interconnecting wires from the chip contacts to existing contacts on a package or on a PCB, or in the case of 3D packaging, between the chip contacts to the contacts of another chip. These bonding wires are usually made of aluminum (Al), copper (Cu) or gold (Au).

Since its discovery at the beginning of the $21^{st}$ century, graphene has attracted much attention due to its properties, such as high electronic mobility, extraordinary thermal conductivity, great strength, flexibility and transparency. Due to these properties, many diverse uses and applications have been researched, such as transparent conductive electrodes and photoactive layers in optoelectronics, Hall-effect sensors for low-magnetic field sensing, diodes, copper interconnects replacements in Very Large Scale Integration (VLSI) semiconductor processes and biosensing, biotechnology and healthcare, to name a few.

In particular, the monolayer structure of graphene allows it to be sensitive to electrostatic perturbations at its surface. The observation of this sensitivity has enabled the development of graphene-based chemical and biological sensors based on graphene solid-state devices, such as diodes, transistors and thyristors, whose operation is based on the change in electrical properties when exposed to a targeted chemical or biological agent. This ultra-sensitivity can be selective if the graphene is functionalized with the right molecules and bioconjugates, that create specific binding sites for the biomarkers of choice to be bond to. This way, when the biomarker interacts with the probe molecule, they bind, producing a change in the electronic state of the probe and linker molecule, if any. This produces a charge transfer into the graphene channel which changes its conductivity. This results in a change in the conductance of graphene and thus a change in the current flowing through the, for example, transistor, which is the output signal. Obtaining electrical readouts—versus chromatographic or optical ones—permits to benefit from well-known techniques for electrical analysis of signals. Thus, graphene sensors or graphene chips, such as chips having one or more graphene solid-state devices, have immense potential for disrupting the diagnosis—and thus healthcare—sector, among other sectors.

There exist different methods of manufacturing graphene solid-state devices. A graphene sensor and its manufacturing process are for example disclosed in WO2022/096640A1.

The already introduced wire bonding process for making physical interconnections between a chip having one or more graphene solid-state devices and its package requires a deposition of metal on each graphene solid-state device and, in particular, on its graphene channel. There are various techniques to deposit metals (metal contacts) in solid-state manufacturing processes involving graphene. Among the existing techniques for metal deposition, there are two of them which are widely used in a vast majority of graphene solid-state devices. These techniques are sputtering and thermal evaporation. While bottom contacts can usually be deposited following any of these techniques, top-contact metallization, which must be suitable for high-speed wire bonding, must guarantee the fulfilment of certain conditions, such as a certain thickness.

Sputter deposition is a physical vapour deposition (PVD) method of depositing thin films of a material (for example, metal) by sputtering material from a target and depositing it onto a substrate, as disclosed for example in Braun M. (2015) Magnetron Sputtering Technique In: Nee A. (eds) Handbook of Manufacturing Engineering and Technology. Springer, London. https://doi.org/10.1007/978-1-4471-4670-4_28. Sputtering involves a plasma gas to assist the deposition and renders a very isotropic evaporation with the possibility of depositing very thick films efficiently. Due to its isotropic character, it is normally used in combination with a double-layer resist patterning scheme, where an imaging resist and a lift-off sacrificial resist (LOR) are used to create an undercut to prevent sidewall deposition and enable a clean lift-off using a strong solvent, such as DMF, DMSO and NMP.

However, this approach entails two problems when it is applied to graphene solid-state devices. First, the plasma used to assist the deposition damages the graphene during the early stages of the deposition, introducing large damage in the graphene film to be contacted by the deposited metal. Second, the solvents involved in the lift-off process, particularly to remove the LOR, damage the graphene, causing its detachment from the substrate. These problems make sputtering an unsuitable technique for metallizing graphene solid-state devices, in particular for their top-contact metallization.

To overcome this, a standard lift-off technique for top-contact can be implemented via thermal evaporation. Thermal Evaporation is a method of Physical Vapor Deposition (PVD). It is a form of Thin Film Deposition, which is a vacuum technology for applying coatings of pure materials (for example, metals) to the surface of an object, as disclosed form example in Safarian, J. Engh, T. A. Vacuum Evaporation of Pure Metals. *Metall Mater Trans A* 44, 747-753 (2013). https://doi.org/10.1007/s11661-012-1464-2. Thermal evaporation relies on the heating of the desired metal, usually via an e-beam or a resistive element, to bring it to its vapour phase, and then condensate it on the target substrate. This enables a mild deposition that, when applied to a graphene solid-state device, preserves the integrity of the graphene film and ensures good contact resistance. However, this technique is limited to a maximum thickness of the metal deposition or metal contact of about 200 nm (nanometers, $10^{-9}$ m), sometimes even 100 nm, due to lift-off limitations. This thickness is incompatible with most of wire bonding techniques, which are essential in post-processing stages of solid-state graphene devices for packaging.

Therefore, there is a need to develop new methods of metallizing graphene solid-state devices which overcome the above-mentioned drawbacks.

SUMMARY

The present disclosure provides a new graphene-based solid-state device and a new method of metallizing a graphene-based solid-state device, which enables reliable contact between the deposited metal and the graphene, while enables the post processing of the die in which the graphene solid-state device is built and its subsequent integration (packaging) in a socket and/or in consumer electronics. The proposed method is especially suitable for the application of top-contact metallization to the graphene solid-state device, since top contacts require a certain minimum thickness of deposited metal to support the subsequent wire bonding process, while the integrity of the graphene channel(s) of the graphene solid-state device must be guaranteed. It is also suitable for graphene devices having both top-contacts and back-contacts.

A die (also referred to as electronic die or chip) is a small block of semiconducting material on which a given functional circuit is fabricated. The term die usually refers to a block of semiconducting material containing an integrated circuit (IC) that has been cut out of a wafer. In the context of the present disclosure the terms “die”, “wafer” and “chip” are used interchangeably.

The disclosure provides a metallization process of a solid-state device (also referred to as semiconductor device) comprising graphene. Semiconductor devices are based on a semiconductor material, such as silicon, germanium, gallium arsenide or an organic semiconductor. The semiconductor conductivity can be controlled by the introduction of an electric or magnetic field, by exposure of light or heat, or by other means, so that the semiconductor material can perform as a sensor. Current flow in a semiconductor occurs due to mobility of free electrons, also called charge carriers. The graphene-based solid-state device can be any solid-state device in which the semiconductor material is graphene, for example a graphene channel. The graphene-based semiconductor device to which the metallization process of the disclosure is applicable can be a two-terminal device, such as a diode, or a three-terminal device, such as a transistor, or an N-terminal device. Non-limiting examples of graphene-based solid-state devices to which the metallization process is applicable are: diodes, triodes, bipolar junction transistors, field-effect transistors, metal-oxide semiconductors, High-electron mobility transistors (HEMTs), thyristors, barristors, memristors, varactors, pn junctions, pin junctions, light emitting diodes, photodetectors, magnetoresistive devices, spin valves, spin torque devices, bolometers and hybrid transition metal dichalcogenide/graphene based heterostructures, among others.

Throughout the disclosure of the present disclosure, the graphene-based solid-state device (graphene-based SSD) is schematically represented by a graphene layer deposited or grown on a substrate and two contacts (metal deposition or metal contacts). Several graphene-based SSDs can be implemented on a single substrate. The graphene layer forms one or more graphene channels of the graphene-based semiconductor device(s). A skilled person in the art will understand that the referral to a substrate, a graphene layer and two metal contacts is a schematic representation of the graphene device, which means that a complete graphene-based SSD may involve other components or elements different from the substrate, graphene channel and metal contacts (for example, dielectric layer(s)) depending on the type of graphene SSD. In other words, only the components of the graphene SSD involved in the metallization process of the graphene layer are explicitly referred to in this disclosure.

For the graphene SSD, or chip comprising one or more graphene SSDs, to be assembled in a package or socket for its later integration in a PCB or other electronics device, wire bonding needs to be applied for making the required interconnections between the graphene channel(s) of the graphene SSD(s) and the external contacts of the socket, package or the like. To build these interconnections, the graphene layer(s) need be metallized following the method of the present disclosure. A graphene SSD normally requires at least two electrical contacts: one contact to enable a subsequent connection (for example, in use of the graphene SSD or once the graphene SSD is assembled in a socket) to an electric negative pole (of, for example, a voltage source) and another contact to enable a corresponding subsequent connection to an electric positive pole (of, for example, the voltage source). In certain circumstances, applicable for example to graphene devices being hybrid devices, only one of the two electrical contacts is in contact with the graphene layer, the second electrical contact being in contact with a material different from graphene.

The method involves patterning the metal depositions. In the context of the present disclosure, patterning involves stages of resist deposition, mask exposure and development. The patterns (geometric shape or profile) of the metallic depositions to be applied to the graphene SSD have been previously designed with computer-aided techniques, such as CAD software or the like. The computer-aided design permits to define areas or regions on the surface of the die over which metallization is to be deposited.

In the present disclosure, the deposition of the metallization (electrical contacts of the graphene SSD) is done in two stages: In a first stage one or more first metallic structures are deposited, each of them partially covering the graphene SSD and the substrate. In a second stage one or more corresponding second metallic structures are deposited, each of them partially covering a respective first metallic structure and the substrate.

In a first aspect of the present disclosure, a method of metallizing a solid-state device comprising a substrate and at least one graphene channel disposed on the substrate is provided. The method comprises applying a first metal deposition stage for depositing at least one first metallic structure, the at least one first metallic structure partially occupying the graphene layer and partially occupying the substrate, wherein a metal deposition technique which does not use plasma is used to deposit the at least one first metallic structure. The method also comprises applying a second metal deposition stage for depositing at least one second metallic structure on a region of the at least one first metallic structure which is not deposited on the graphene channel.

In embodiments of the disclosure, the at least one graphene channel is either deposited or grown on the substrate.

In some embodiments, the substrate is a sacrificial substrate, meaning that a graphene device may be fabricated on the sacrificial substrate and then transferred to another substrate. Any suitable substrate material may be used as sacrificial substrate, providing the substrate material is compatible with the different fabrication steps.

In embodiments of the disclosure, the first metal deposition stage is done as follows: patterning on the graphene channel and substrate the geometry of the at least one metallic structure to be deposited; depositing the at least one first metallic structure on the applied pattern.

In embodiments of the disclosure, the patterning is done as follows: depositing a mask layer on the graphene layer and on the substrate not covered by the graphene layer; creating an inverse pattern in the mask layer by removing the mask layer in the regions where the metal is to be deposited, and leaving the mask layer in the regions to be protected.

In embodiments of the disclosure, the at least one first metallic structure is deposited as follows: applying a metallic layer; lifting off the remaining mask layer, thus removing the metal deposited on the remaining mask layer and at least one metal structure remaining only in the regions where metal has a direct contact with the substrate and/or graphene layer.

In embodiments of the disclosure, the first metal deposition stage is made by evaporation or by electro-deposition or by electroplating.

In embodiments of the disclosure, the at least one metallic structure deposited in the first metal deposition stage has a thickness in the range of between 0.1 and 1000 nanometers.

In embodiments of the disclosure, the second metal deposition stage is done as follows: patterning on the at least one first metallic structure and substrate the geometry of the at least one second metallic structure to be deposited; depositing the at least one second metallic structure on the applied pattern.

In embodiments of the disclosure, the patterning is done as follows: depositing a first mask layer; depositing a second mask layer on the first mask layer; creating an inverse pattern in the mask layers by removing the mask layers in the regions where the metal is to be deposited.

In embodiments of the disclosure, the second mask layer has a higher developing rate than the first mask layer, which creates an undercut structure that eases lift-off.

In embodiments of the disclosure, the at least one second metallic structure is deposited as follows: applying a metallic layer; lifting off the remaining mask layers, thus removing the metal deposited on the remaining mask layers, so that the at least one second metallic structure remains only in the regions where metal has a direct contact with the substrate and/or the at least one first metallic structure.

In embodiments of the disclosure, the second metal deposition stage is made by one of the following metal deposition techniques: CVD, MOCVD, MOVPE, PECVD, ALD, PEALD, sputtering, such as DC diode sputtering, RF sputtering, magnetron sputtering, reactive sputtering, high-power impulse magnetron sputtering, ion beam deposition and electroplating.

In embodiments of the disclosure, the at least one second metallic structure deposited in the second metal deposition stage has a thickness in the range of between 100 nanometers and 1000 microns.

In embodiments of the disclosure, the substrate is made of at least one of glass, quartz, silicon (Si), germanium (Ge), silicon carbide, gallium arsenide, an organic semiconductor, SiO2/Si, SiO2, Al2O3, ZrO2, HfO2, HfSiO4, Ta2O5, La2O3, LaAlO3, Nb2O5, TiO2, BaTiO3, SrTiO3, CaCu3Ti4O12, Si3N4, ZrSiO4, Y2O3, CaO, MgO, BaO, WO3, MoO3, Sc2O3, Li2O or SrO.

In embodiments of the disclosure, at least one of the at least one first metallic structure and the at least one second metallic structure is made of at least one of: Titanium (Ti), Nickel (Ni), Gold (Au), Palladium (Pd), Cobalt (Co), Chromium (Cr), Aluminum (Al), Tungsten (W), TaN, (Tantalum Nitride), TIN (Titanium Nitride), Silicon (Si), doped Silicon (doped Si), poly-silicon (poly-Si), Cobalt monosilicide (CoSi), Platinum (Pt), Copper (Cu), Silver (Ag), Lead (Pb), Iron (Fe), Co/Fe alloy, and combinations/alloys of these materials.

In a second aspect of the present disclosure, a graphene-based solid-state device is provided. It comprises a substrate and at least one graphene channel disposed on the substrate. The solid-state device also comprises: at least one first metallic structure partially occupying the graphene layer and partially occupying the substrate, wherein the at least one first metallic structure has been deposited following a metal deposition technique which does not use plasma; at least one second metallic structure partially deposited on a region of the at least one first metallic structure which is not deposited on the graphene channel.

In a third aspect of the present disclosure, a method of packaging in a socket a die is provided. The die comprises at least one graphene-based solid-state device according to the second aspect of the disclosure. The method comprises wire bonding each of the at least second metallic structures of the at least one graphene-based solid-state device to a corresponding contact of a socket.

In a fourth aspect of the present disclosure, a package is provided. The package comprises: a die (10) comprising at least one graphene-based solid-state device according to the second aspect of the disclosure; and a socket. Each of the at least second metallic structures of the at least one graphene-based solid-state device is wire bonded to a corresponding contact of the socket.

The combination of the two metallization steps enables a reliable top-contact to graphene without damaging the graphene, while enables the post processing of the dies and their subsequent integration through packaging in consumer electronics.

Additional advantages and features of the disclosure will become apparent from the detailed description that follows and will be particularly pointed out in the appended claims.

BRIEF DESCRIPTION OF THE DRAWINGS

To complete the description and in order to provide for a better understanding of the disclosure, a set of drawings is provided. Said drawings form an integral part of the description and illustrate an embodiment of the disclosure, which should not be interpreted as restricting the scope of the disclosure, but just as an example of how the disclosure can be carried out. The drawings comprise the following figures.

DETAILED DESCRIPTION OF THE DRAWINGS

The following description is not to be taken in a limiting sense but is given solely for the purpose of describing the broad principles of the disclosure. Next embodiments of the disclosure will be described by way of example, with reference to the above-mentioned drawings showing apparatuses and results according to the disclosure.

Figure 1A:
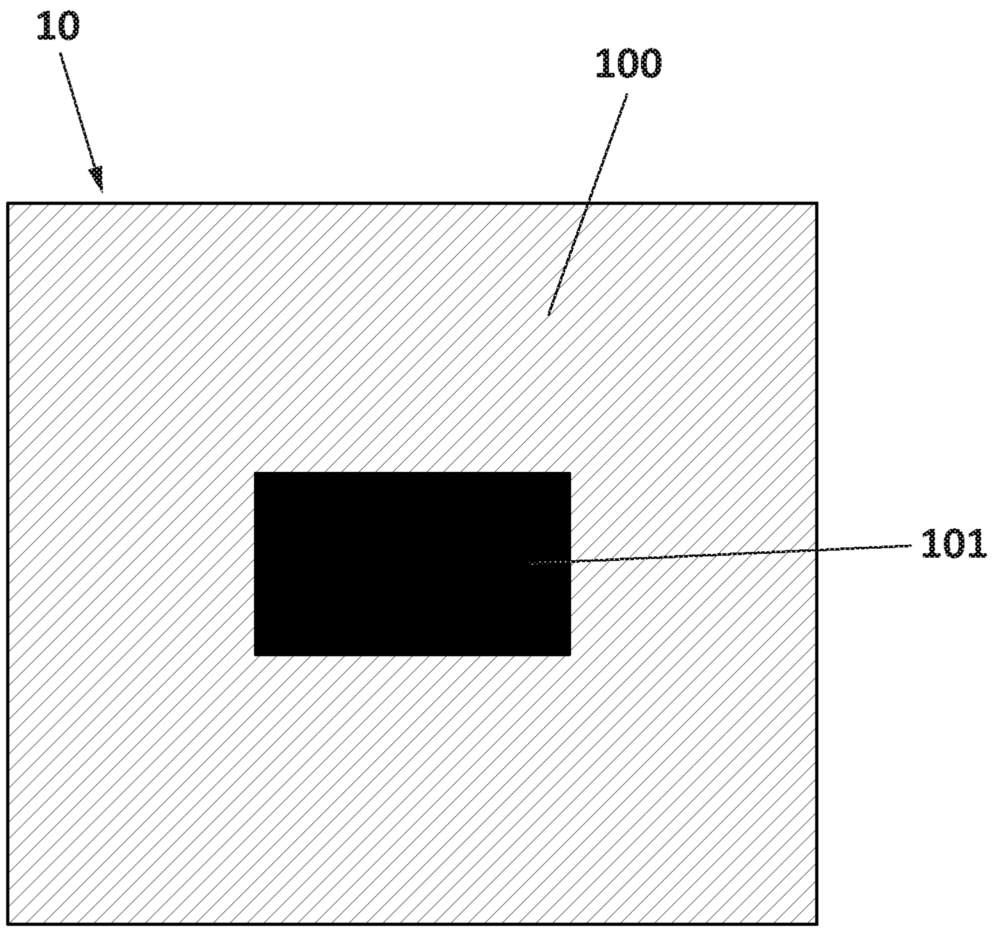
FIGS. 1A and 1B respectively illustrate a top view and a cross-section view of a graphene film deposited on a substrate.
Figure 1B:
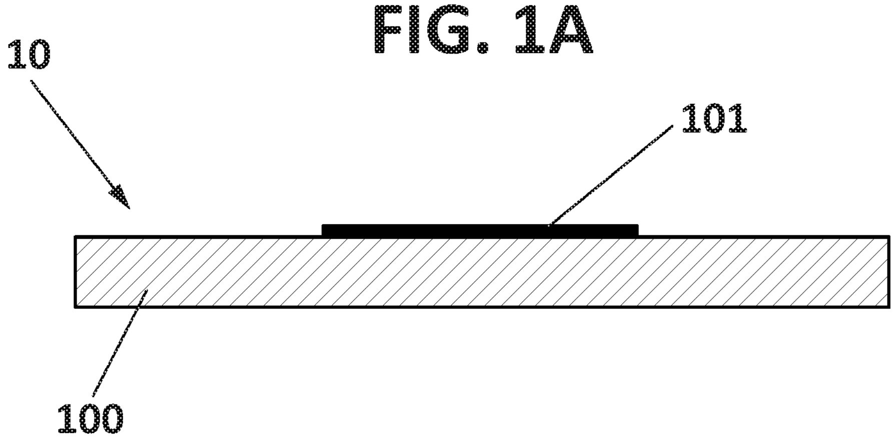

FIGS. 1A to 6C schematically represent the metallization process of a solid-state device comprising graphene implemented in an electronic die or wafer 10, according to embodiments of the disclosure. In FIGS. 1A (top view) and 1B (cross-section view), a graphene layer 101 deposited or grown on a substrate 100 is represented. The substrate may comprise a semiconductor material, such as glass, quartz, silicon (Si), germanium (Ge), silicon carbide, silicon oxide, gallium arsenide, an organic semiconductor, SiO2/Si, SiO2, Al2O3, ZrO2, HfO2, HfSiO4, Ta2O5, La2O3, LaAlO3, Nb2O5, TiO2, BaTiO3, SrTiO3, CaCu3Ti4O12, Si3N4, ZrSiO4, Y2O3, CaO, MgO, BaO, WO3, MoO3, Sc2O3, Li2O or SrO. In embodiments of the disclosure, the substrate may be formed by two layers (upper layer and lower layer). The lower layer may be made of one of silicon, silicon oxide, glass, quartz and polymeric material. The higher layer may be made, for example, of glass, quartz, Si, SiO2/Si, SiO2, Al2O3, ZrO2, HfO2, HfSiO4, Ta2O5, La2O3, LaAlO3, Nb2O5, TiO2, BaTiO3, SrTiO3, CaCu3Ti4O12, Si3N4, ZrSiO4, Y2O3, CaO, MgO, BaO, WO3, MoO3, Sc2O3, Li2O or SrO. For example, the substrate may be formed by a silicon dioxide layer deposited on a silicon substrate layer, in turn obtained from doped silica (n++Si). The graphene layer 101 has been deposited or grown on the substrate 100 by any conventional process of deposition or transfer of graphene. Such process is out of the scope of the present disclosure. Examples of methods of depositing or transferring graphene are disclosed in EP2937313B1, EP3367423B1, EP2679540A1 and EP3135631A1, which are herewith incorporated by reference.

The process flow is the following: the metal contacts are defined through semiconductor lithographic techniques over a graphene film, which can be patterned, for example following standard lithographic techniques. The patterns of the metallic depositions to be applied on the die (graphene device) have been previously designed with computer-aided techniques, such as CAD software or the like. The computer-aided design permits to define areas or regions on the surface of the die over which metallization is to be deposited. The metallization process is aimed at creating two electrical contacts in the graphene SSD: one contact to enable a subsequent connection to an electric negative pole (of, for example, a voltage source) and another contact to enable a corresponding subsequent connection to an electric positive pole (of, for example, the voltage source). The metallization process is carried out in two stages: In a first stage, a mild deposition is applied, which does not damage the graphene and ensures good contact resistance. In a second stage, a thick deposition is applied, which enables to perform the wire bonding with a socket/chip carrier/PCB. The metallization process is explained in detail next.

In a first stage, the metal contacts to be later deposited are patterned or defined over the graphene layer 101, for example following a semiconductor lithographic technique. In this stage, the geometry of the metallic structure(s) to be deposited is patterned on the graphene channel (or layer) 101 and substrate 100. By applying this process (for example, a semiconductor lithographic process), a circuit pattern can be exposed on the graphene layer. In other words, parts of the graphene layer are patterned with the structure (geometry, shape, etc.) to be later adopted by the metal, once deposited. Lithography uses for example light or electrons to transfer a geometric pattern from a photomask to a light-sensitive chemical resist (also called photoresist), on the substrate (in this case, graphene layer). In other words, the light-sensitive chemical resist is first disposed on the substrate and graphene and then the pattern is exposed to be transferred to the graphene. Non-limiting examples of semiconductor lithographic techniques that can be used are X-ray lithography, electron-beam lithography, focused ion beam lithography, optical projection lithography, electron and ion projection lithography, nanoimprint lithography, proximity probe lithography, and near-field optical lithography.

The metallization can be made using a lift-off process. The lift-off process is an additive technique in which a pattern of a target material (metal) is created on a surface (graphene layer and partially substrate) using a mask material (e.g. photoresist). Lift-off can be done by performing photolithography on the wafer 10 before performing a metal deposition and then removing the applied photoresist, for example with a chemical etch.

Figure 2A:
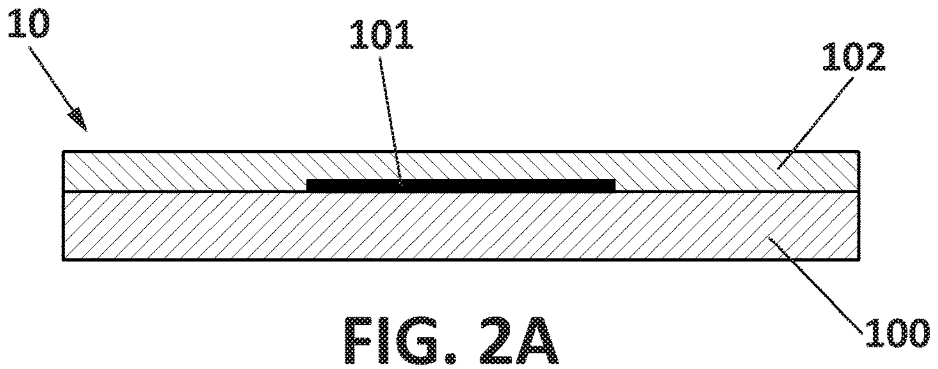
FIGS. 2A-2C respectively illustrate a top view, cross-section view and top view of stages involved in patterning metal contacts of a first deposition stage to be later deposited over the graphene layer and substrate, according to an embodiment of the present disclosure.
Figure 2B:
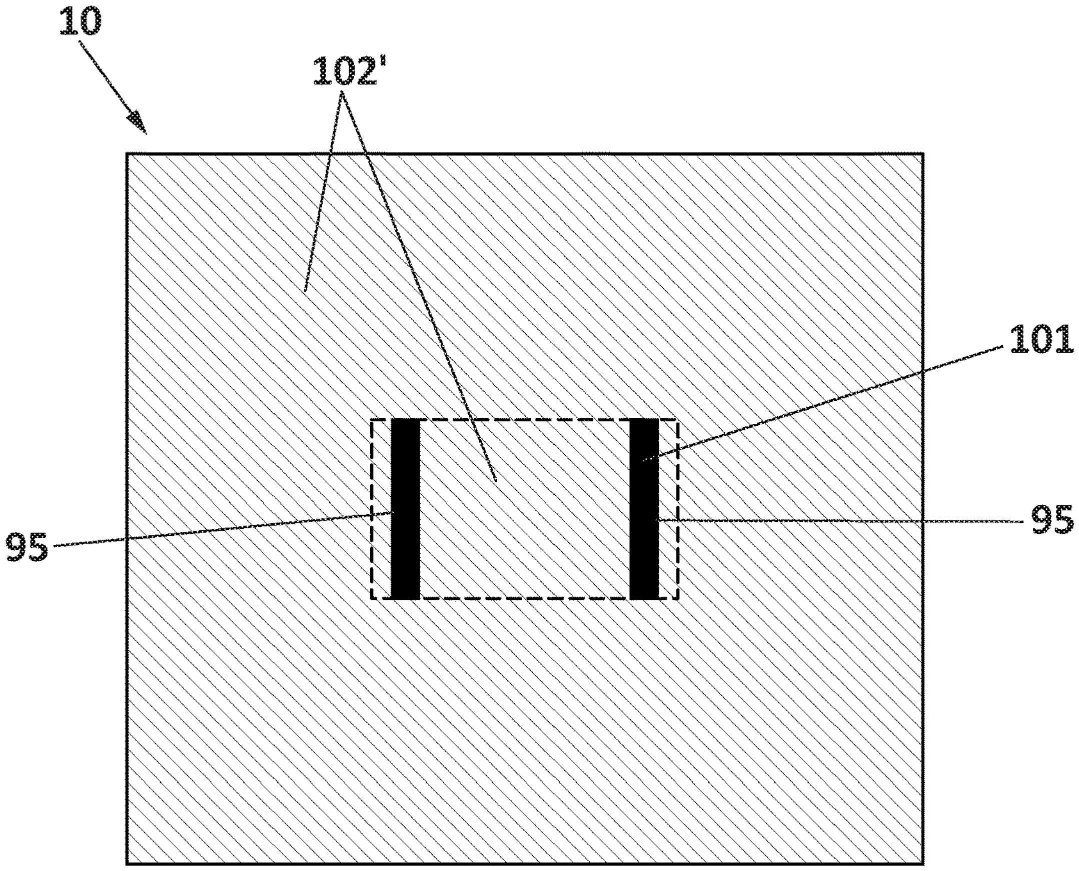
Figure 2C:
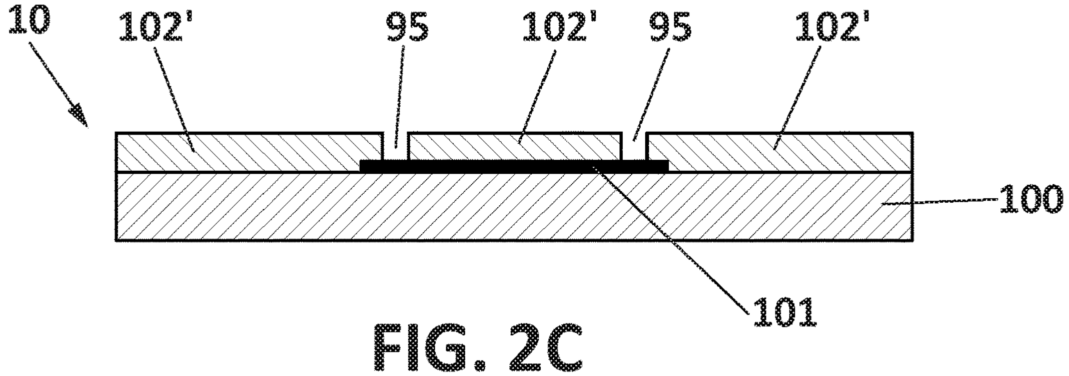

The patterning process is shown in FIGS. 2A-2C. First, a mask layer or resist (e.g. photoresist) 102 is deposited on the surface of the substrate 100 and graphene layer 101, as shown in FIG. 2A. The thickness of the mask layer 102 may be between 50 nm (nanometer, $10^{-9}$ m) and 500 μm (microns, $10^{-6}$ m) An inverse pattern is created in the mask layer 102, for example by exposing and developing the photoresist. This way, a geometric pattern representing the metal to be deposited is transferred from a photomask to the light-sensitive mask material. The photoresist is then removed in the areas where the metal is to be located, creating an inverse pattern. In other words, by removing (for example, developing) openings through the mask layer 102, later the target material (metal) can reach the surface of the substrate 100 and/or graphene layer 101 in those regions, where the final pattern is to be created. The graphene layer 101 and substrate 100 are not removed by the developing of the mask layer 102. FIGS. 2B-2C show the remaining mask layer 102' after the inverse pattern is created and the openings 95 are developed. Depending on the mask material, various methods can be used, such as Extreme ultraviolet lithography (EUVL), Electron beam lithography (EBL), proximity lithography, contact lithography or immersion lithography.

Figure 3A:
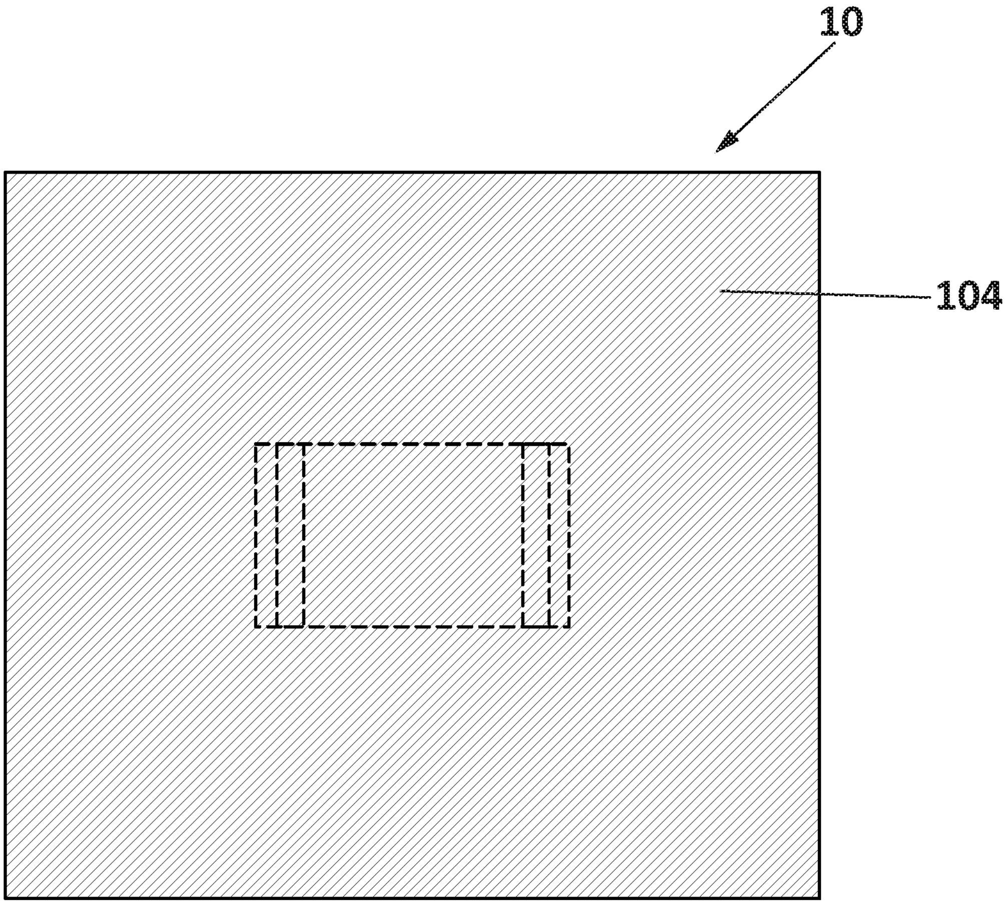
FIGS. 3A and 3B respectively illustrate a top view and a cross-section view of a metallization layer applied on the previously patterned graphene layer and substrate, according to an embodiment of the present disclosure.
Figure 3B:
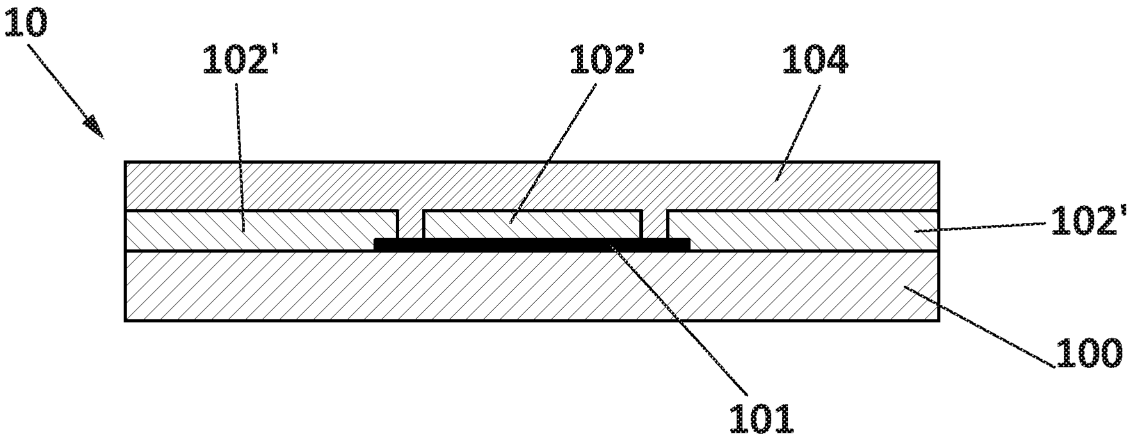

Then, as shown in FIGS. 3A-3B, the graphene SSD is metallized, for example following a top contact approach, such as via evaporation of metal, such as thermal evaporation or e-beam evaporation, or by electro-deposition, or by electroplating. Any non-aggressive deposition technique can be used for applying this first metallization on the graphene channel 101, so that the graphene channel 101 is not damaged. In particular, any deposition technique which does not use plasma can be used. This first metallization process does not damage the graphene channel 101 because the metallization technique (such as evaporation, electro-deposition, or electroplating) is not aggressive because it does not require plasma. Non-limiting examples of metals or metallic compounds used in the deposition process are: Titanium (Ti), Nickel (Ni), Gold (Au), Palladium (Pd), Cobalt (Co), Chromium (Cr), Aluminum (Al), Tungsten (W), TaN, Silicon (Si), doped Silicon (doped Si), poly-silicon (poly-Si), Cobalt monosilicide (CoSi), Platinum (Pt), Copper (Cu), Silver (Ag), Lead (Pb), Iron (Fe), Cobalt-Iron (CoFe), and combinations/alloys of these materials or compounds.

In this metallization stage, the metallic layer 104, usually a thin metal layer, is deposited over the whole area of the die 10, reaching the surface of the substrate 100 and/or graphene layer 101 in the etched regions 95 and staying on the top of the mask layer 102' in the regions where it was not previously developed. The thickness of the metal layer 104 is between 0.1 and 1000 nm, such as between 1 and 100 nm. In other words, this layer 104 covers the remaining resist 102' as well as parts of the wafer (substrate 100 and/or graphene layer 101) that were cleaned of the resist in the previous developing step. Subsequently, when the mask layer 102' (e.g. resist or photoresist) is washed away (for example, photoresist in a solvent), the metal on the top of the mask layer 102' is lifted-off and washed together with the mask layer 102' below. After the lift-off, the deposited material (metal) 104 remains only in the regions 95 where it had a direct contact with the substrate 100 and/or graphene layer 101 (deposited metal 104' in FIGS. 4A-4B). Each metal path 104' (see for example FIG. 4A) exceeds the graphene channel 101, that is to say, it occupies a portion of the graphene channel 101 and a portion of substrate 100 in the vicinity of the graphene channel, so that the second metal deposition stage can be performed on the portion of metal path 104' disposed on the substrate and separated from the graphene channel. In sum, only the metallic material that was in the holes 95 having direct contact with the underlying layer (substrate/graphene layer) stays. The thickness of the one or more metallic structures 104' is in the range of between 0.1 and 1000 nm, such as between 1 and 100 nanometers. This mild deposition of metal does not damage the graphene because it does not require the use of plasma, and ensures good contact resistance, which is a physical parameter used to characterize the quality of an electrical contact and its electron injection into a device.

Figure 4A:
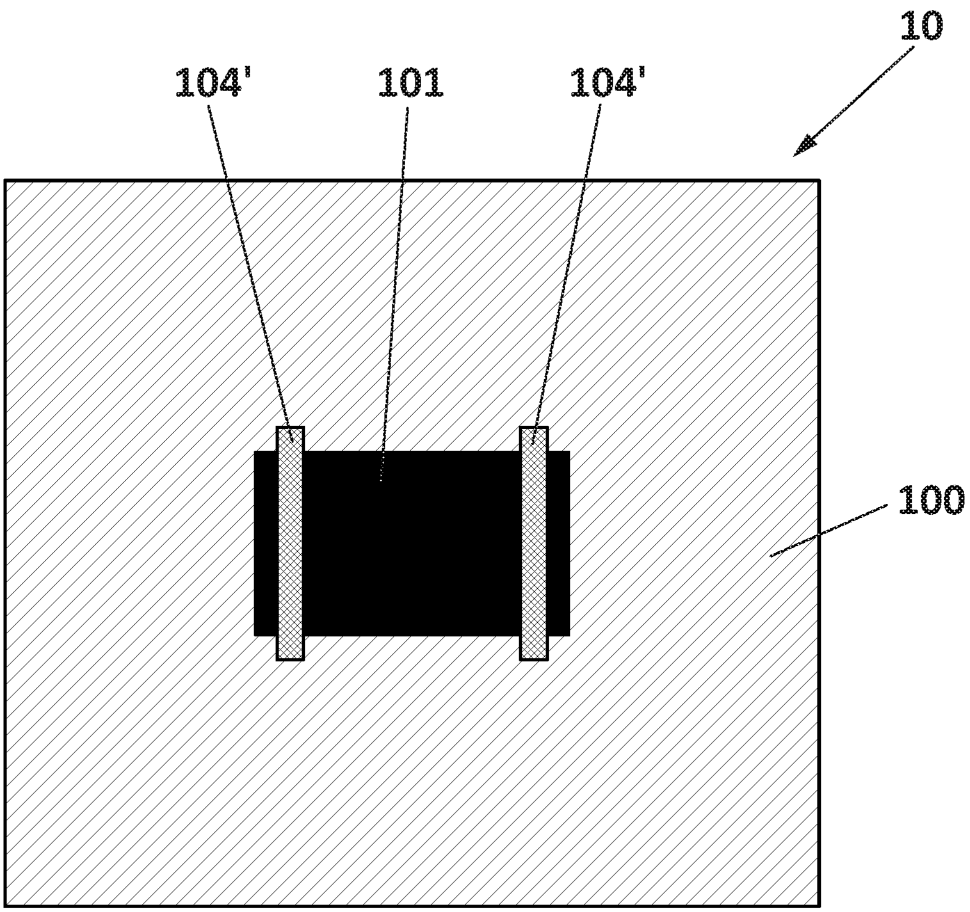
FIGS. 4A and 4B respectively illustrate a top view and a cross-section view of two metallic structures or paths deposited on the wafer once a previously deposited sacrificial layer has been removed.
Figure 4B:
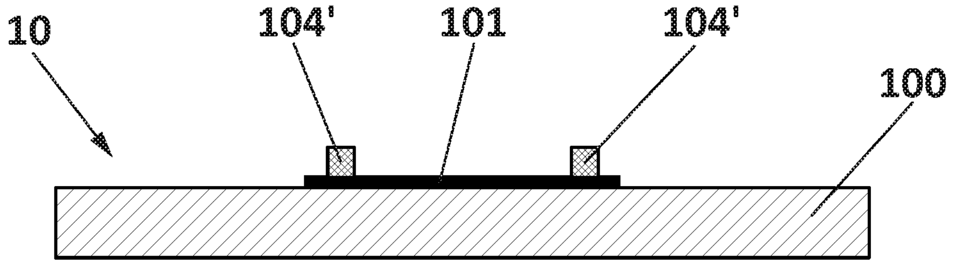

FIGS. 4A-4B show two metallic structures or paths 104' deposited on the die 10 once the mask layer 102' has been removed, and therefore the metal deposited on the mask layer 102' has also been removed. After the lift-off, the deposited material (metal) remains only in the regions 95 where metal had a direct contact with the substrate 100 and/or graphene layer 101 (deposited metal 104' in FIGS. 4A-4B). As shown in FIG. 4A, it is important that in this first metal deposition stage each metallic path 104' is partially deposited on the graphene layer 101 and partially deposited on the substrate 100, so that in the second metal deposition stage, metal can be deposited on the portion of metallic path 104' placed on the substrate 100, in such a way that the graphene layer 101 is preserved and not damaged. In the example shown in FIG. 4A, each of the two metallic structures 104' is an elongated metallic structure having a portion deposited on the graphene channel 101 and a portion deposited on the substrate 100. Having a portion of metallic structure on the graphene channel 101 is essential to enable electric contact with the graphene channel 101. In turn, having a portion of metallic structure on the substrate 100 is required in the manufacturing process so that the subsequent metallic deposition, which must be thicker, is not made on the graphene channel 101, which would otherwise be damaged by the second metallic deposition. Each elongated metallic structure 104' is therefore a metallic path connecting the graphene channel 101 and a region on the substrate 100 in which no graphene channel has been deposited or grown. Although in FIG. 4A both ends of each elongated metallic structure 104' are disposed on the substrate 100 (and not on the graphene channel 101), in other embodiments it suffices if one of the ends of each elongated metallic structure 104' is disposed on the substrate 100.

As shown in the figures, two metallic structures 104' have been created. Two metallic structures 104' are preferably made on the graphene SSD so that one metallic structure enables a subsequent connection of the graphene SDD to an electric negative pole (of, for example, a voltage source, not shown) and another metallic structure enables a subsequent connection of the graphene SSD to an electric positive pole (of, for example, the not shown voltage source). However, the metallization process of the present disclosure could alternatively involve a single metallic structure 104' if the graphene device requires a single electrical connection to a socket, PCB, or the like, for example in the case of a graphene device being a hybrid device.

So far, a first deposition of metal has been made, which has resulted in at least one metallic path 104' or first contact connecting the graphene channel 101 and a region on the substrate 100 which is free of graphene.

Subsequently, another deposition stage is carried out, in which a thick metal layer is deposited. The thick metal deposition enables the ulterior connection by means of wire bonding with a contact in the socket or PCB in which the wafer is going to be assembled. Non-limiting examples of techniques used to perform this second metal deposition are: CVD, MOCVD, MOVPE, PECVD, ALD, PEALD, sputtering, such as DC diode sputtering, RF sputtering, magnetron sputtering, reactive sputtering or high-power impulse magnetron sputtering, ion beam deposition and electroplating, among others. This second deposition stage is preferably made using the technique of sputter deposition, which enables thick depositions of metal. Any other deposition technique which enables efficient deposition of thick layers of metal can be used alternatively. The thickness of the second deposition is in the range of between 100 nm and 1000 μm, such as between 200 nm and 20 μm.

To do this, another lithographic stage is carried to define or pattern one or more second metallic depositions (one second metallic deposition per previously deposited metallic structure 104'). The one or more second metallic depositions will enable the electrical connection with existing contacts on a package, socket, PCB or another chip, without damaging the graphene layer 101. The connection between each second metallic deposition and the corresponding existing contact on a package or the like will be made using interconnecting wires (bonding wires). The bonding wires, which are out of the scope of the present disclosure, are typically metallic. Non-limiting examples of materials of which the bonding wires are made are aluminum (Al), copper (Cu) or gold (Au). This lithographic stage is preferably done applying a double-layer resist patterning scheme, where an imaging resist and a lift-off sacrificial resist (LOR) are used to create an undercut to prevent sidewall metal deposition during the metal deposition, and enable a clean lift-off of the double-layer resist using a strong solvent, such as DMF, DMSO and NMP, among other organic solvents, after the metal deposition.

As already explained, the patterns to be defined on the die have been previously designed with computer-aided techniques, such as CAD software or the like. The computer-aided design permits to define areas or regions on the wafer Surface over which metallization (in this case, second metallization) is to be deposited.

First, the second metallic depositions must be patterned, involving a complete process of depositing a resist, exposing a mask and developing the resist. FIGS. 5A-5D show stages involved in patterning metal contacts of the second deposition stage to be later deposited, at least partially, over the first metallic structures, according to an embodiment of the present disclosure.

Figure 5A:
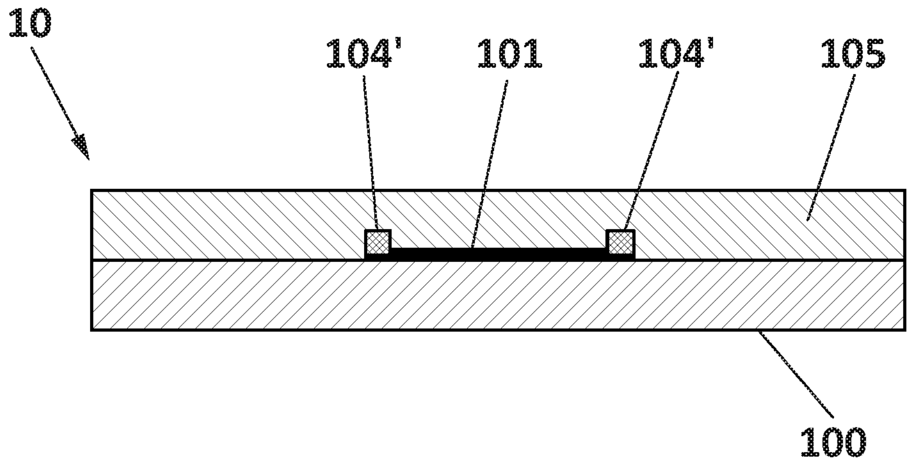
FIGS. 5A-5D respectively illustrate a cross-section view, another cross-section view, a top view and still another cross-section view, of stages involved in patterning metal contacts of a second deposition stage to be later deposited over the first metallic structures, according to an embodiment of the present disclosure.
Figure 5B:
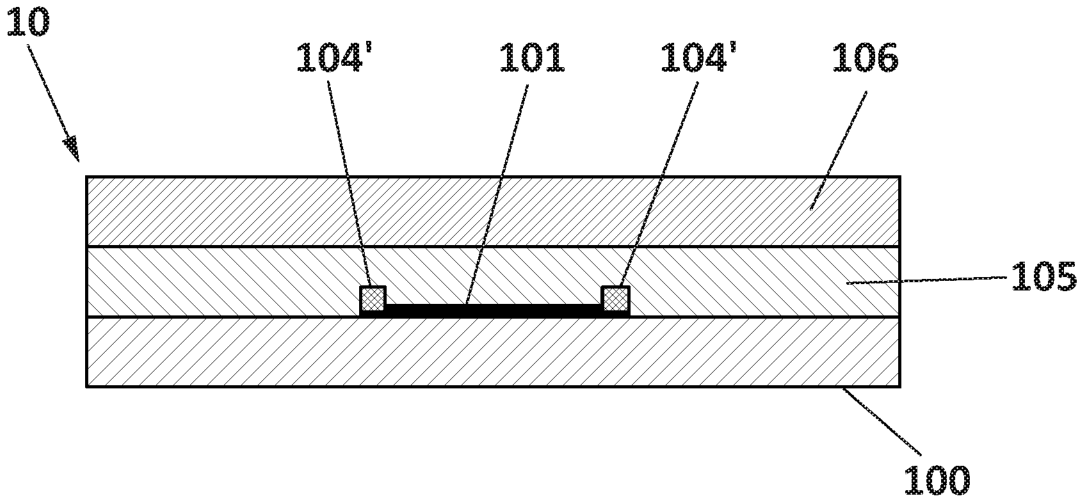

In the embodiment shown in FIGS. 5A-5D, the second lithographic stage is a double layer lift-off process, in which two mask layers 105, 106 are deposited: First, a lift-off mask layer (lift-off mask resist, LOR) 105 is deposited over the whole area of the wafer 10, covering the first metallic structures 104', the portions of the graphene channel 101 not covered by metal and the portions of the substrate 100 not covered by graphene or metal. The thickness of the first lift-off mask layer 105 is between 100 nm and 1000 μm. The material of this mask layer 105 is, for example, polydimethylglutarimide (PMGI). It is shown in FIG. 5A. A second lift-off resist 106 is then deposited on the LOR 105. This is shown in FIG. 5B. The thickness of the second lift-off resist 106 is between 10 nm and 1000 nm. It can be a negative resist or a positive resist. The layer 106 has a higher developing rate than the layer 105; this creates an undercut structure that eases lift-off. A LOR process is now enabled because the graphene 101 is covered with lift-off resists and thus protected from lift-off solvents, which are used after deposition of the metal to remove the metal from the regions different from the previously patterned ones.

Figure 5C:
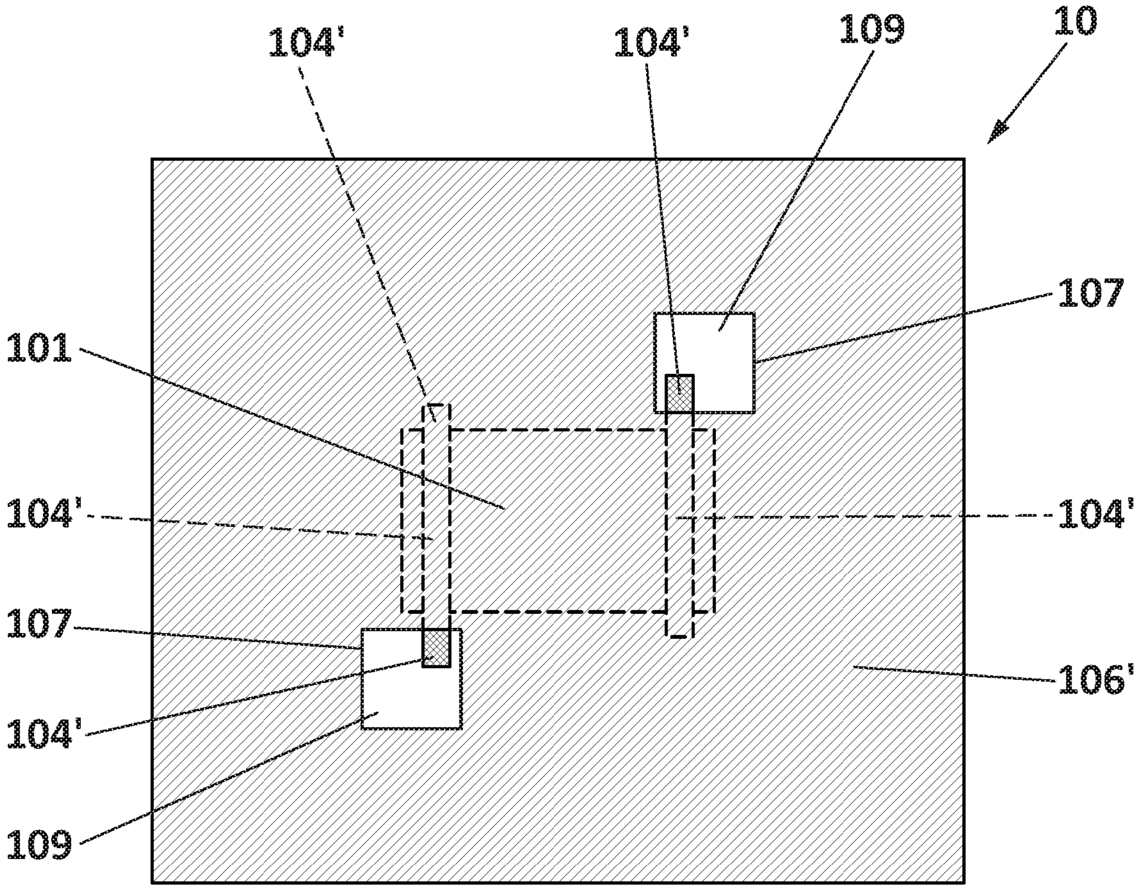
Figure 5D:
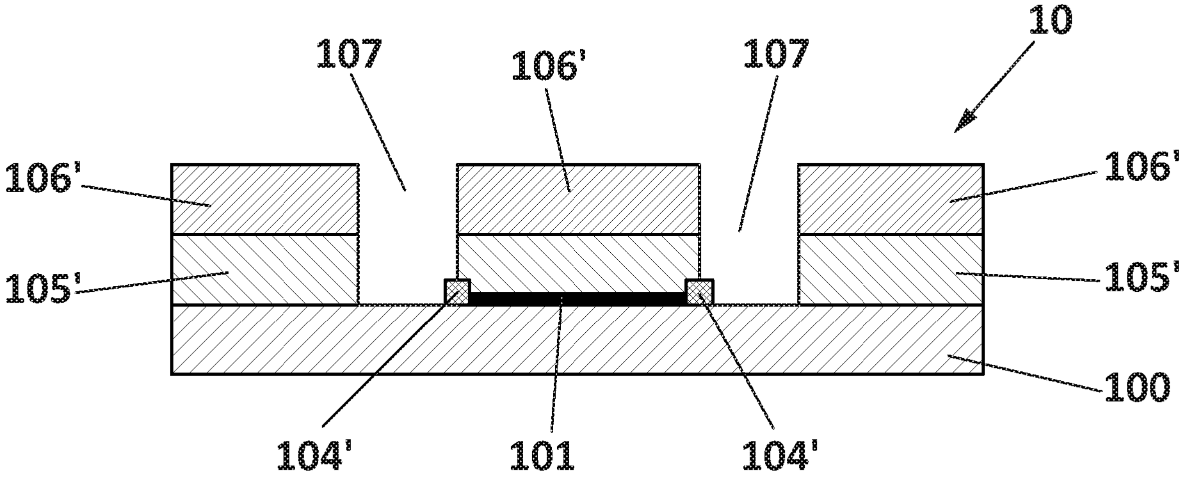

An inverse pattern is created in the sacrificial layers 105, 106, for example by exposing and developing the resists. The resists 105, 106 are removed in the areas, where the metal is to be located, creating an inverse pattern. FIG. 5C shows the areas 109 in which metal is to be located in the second metal deposition stage as such. In other words, by removing (for example, developing) openings through the resists 105, 106, the metal can later, when it is deposited, reach the surface 109 of the wafer (substrate 100 and/or first metal structures 104') on which it must be deposited. FIG. 5D shows the remaining resist layers 105, 106 after the inverse pattern is created and the openings 107 are etched. Besides, this double layer lift-off process allows for much thicker metallization via, for example, lift-off and sputtering, enabled by the fact that the graphene is protected by resist and only the previously deposited contact metal 104' is exposed.

Figure 6A:
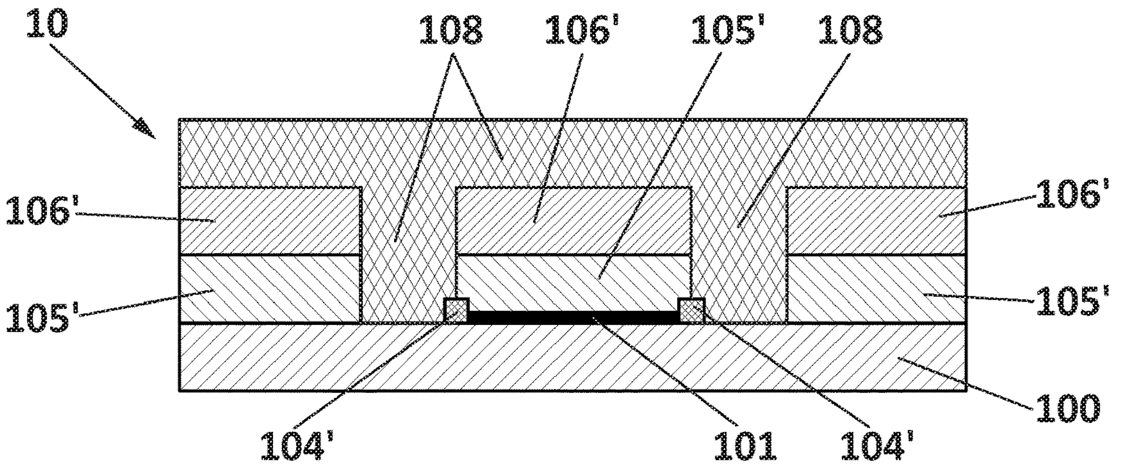
FIGS. 6A-6C respectively illustrate a cross-section view, a top view and another cross-section view of a second metallization stage according to an embodiment of the present disclosure.
Figure 6B:
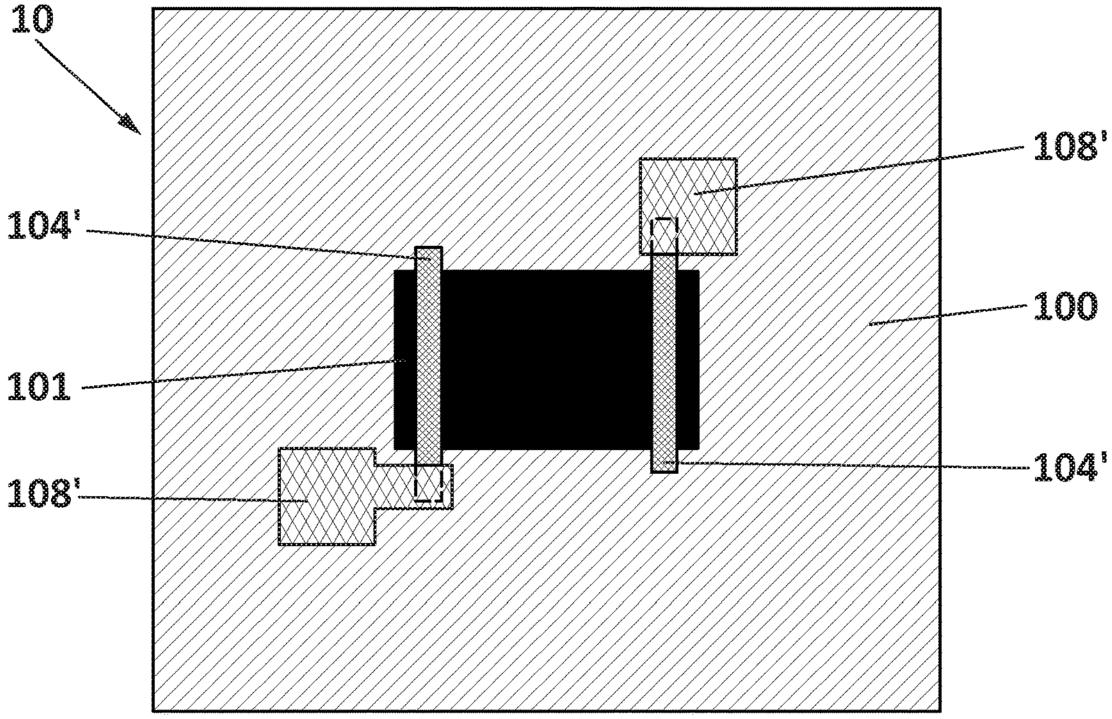
Figure 6C:
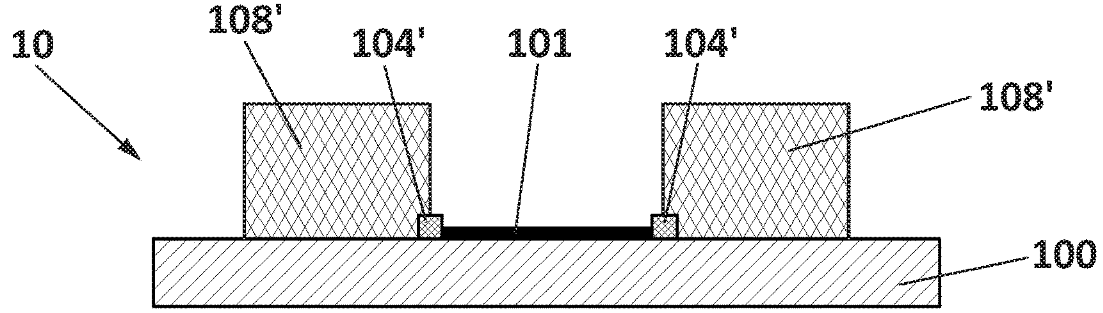
Figure 7A:
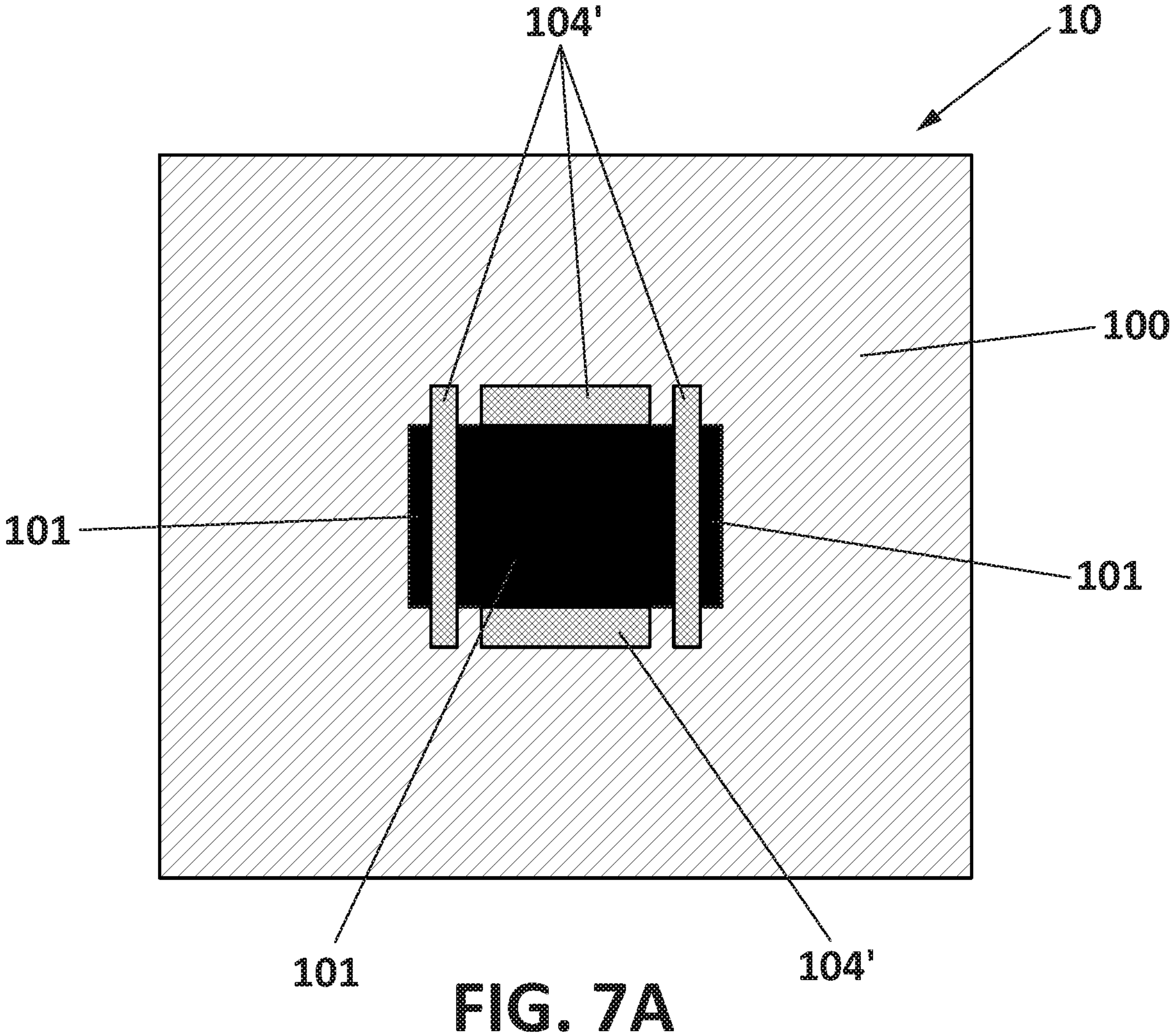
FIGS. 7A-7D schematically show the two metallization stages for a 3-probe graphene device.
Figure 7B:
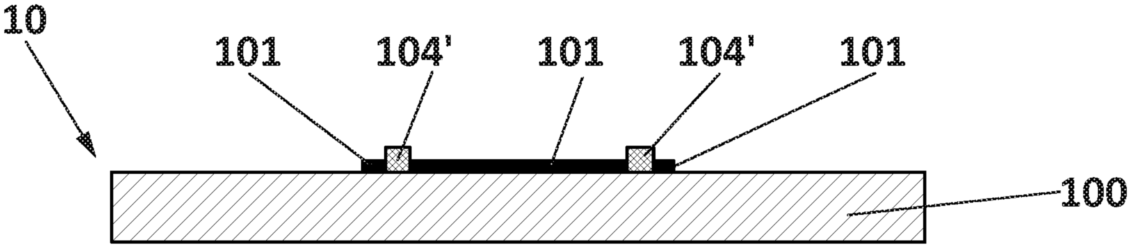
Figure 7C:
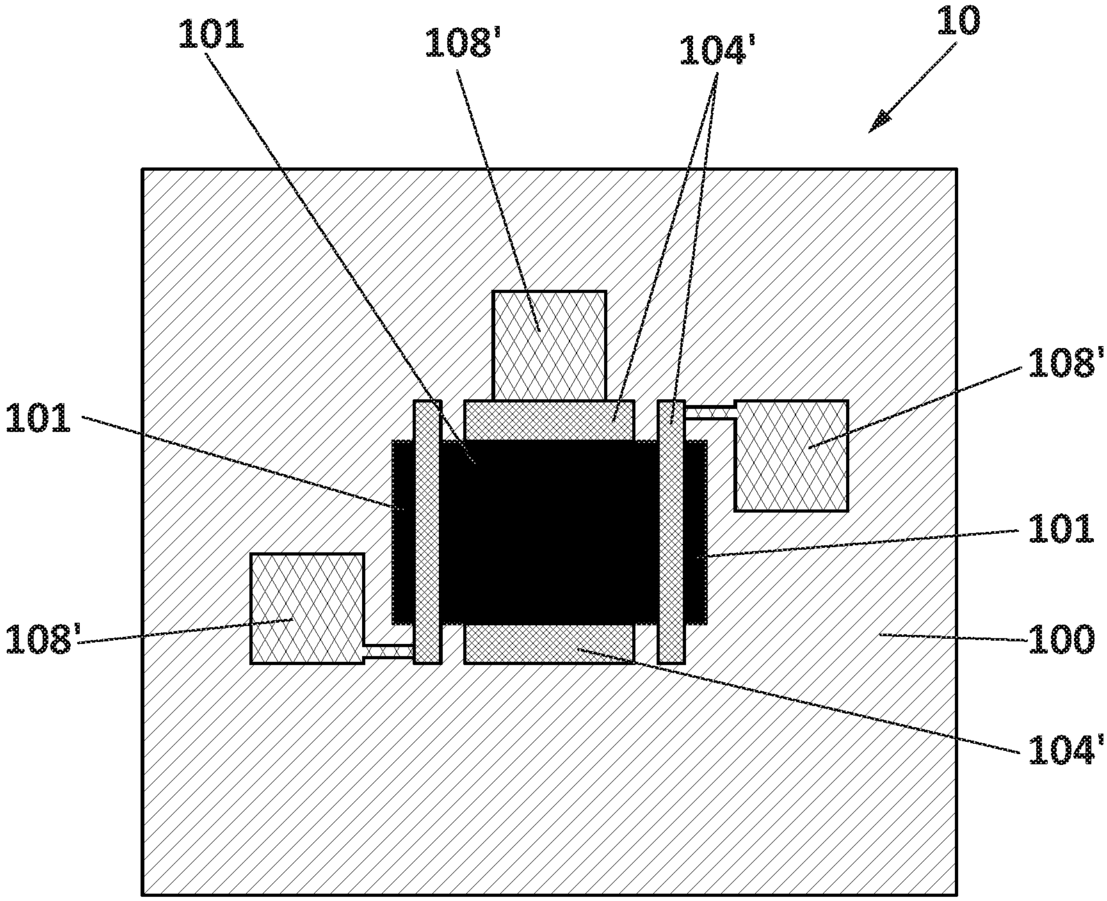
Figure 7D:
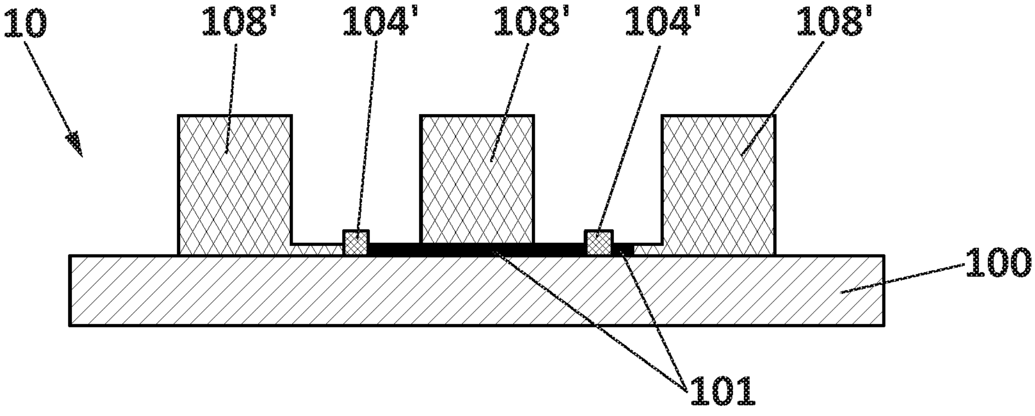
Figure 8A:
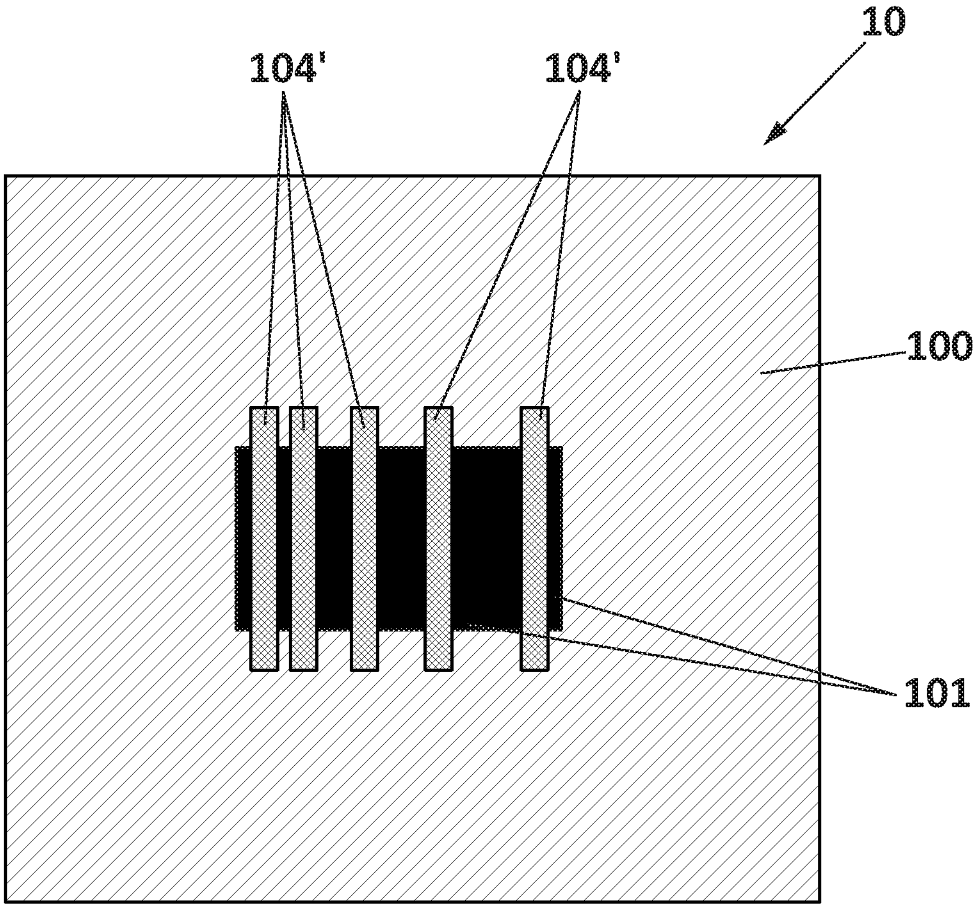
FIGS. 8A-8D schematically show the two metallization stages for an N-probe graphene device.
Figure 8B:
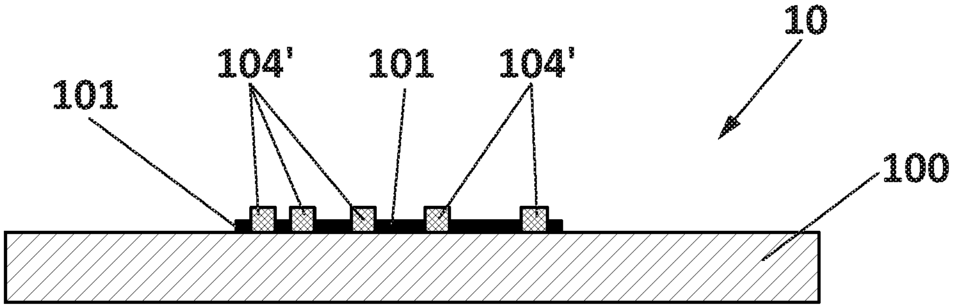
Figure 8C:
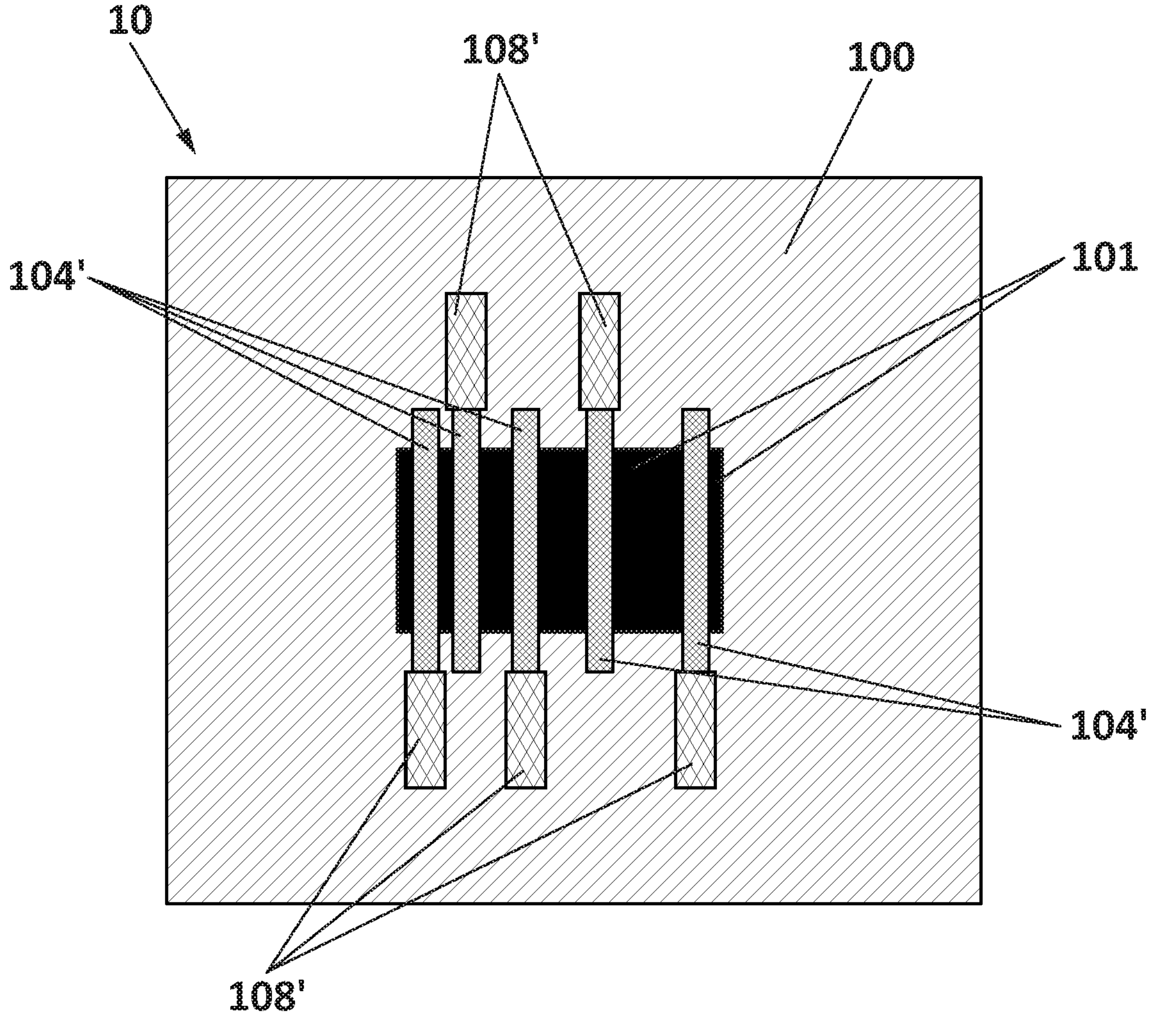
Figure 8D:
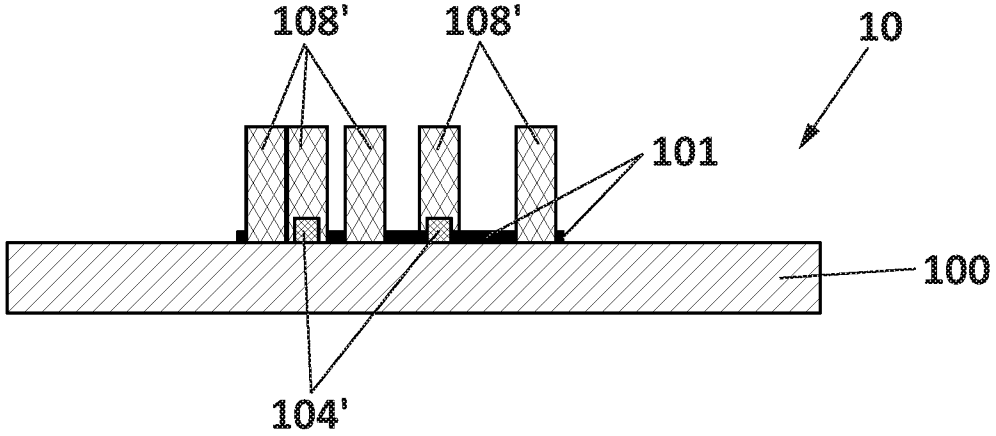

Then, as shown in FIGS. 6A-6C, a second deposition of metal is applied. Any technique for metal deposition can be applied, provided it enables thick depositions of metal. Non-limiting examples of deposition techniques that may be applied are: CVD, MOCVD, MOVPE, PECVD, ALD, PEALD, sputtering (such as DC diode sputtering, RF sputtering, magnetron sputtering, reactive sputtering or high power impulse magnetron sputtering), ion beam deposition and electroplating. The second deposition of metal is preferably applied by sputter deposition. Non-limiting examples of metals or metallic compounds used in the sputter deposition process are: Titanium (Ti), Nickel (Ni), Gold (Au), Palladium (Pd), Cobalt (Co), Chromium (Cr), Aluminum (Al), Tungsten (W), Titanium Nitride (TIN), Silicon (Si), doped Silicon (doped Si), poly-silicon (poly-Si), Cobalt monosilicide (CoSi), Platinum (Pt), Copper (Cu), Silver (Ag), Lead (Pb), Iron (Fe), Cobalt-Iron (CoFe), and combinations/alloys of these materials.

In this second metallization stage, the metallic material 108 is deposited over the whole upper surface of the wafer 10, reaching the surface of the substrate 100 and/or first metal structures 104' in the etched regions (openings 107 in FIG. 5D) and staying on the top of the resist layer 106 in the regions 107 where it was not previously etched. The thickness of the second metal layer 108 is in the range of between 100 nm and 1000 μm, such as between 200 nm and 20 μm. In other words, this metallic layer 108 covers the remaining resist 106 as well as parts of the wafer (substrate 100 and/or metal structures 104') that were cleaned of the resist in the previous developing step. Subsequently, when the resist layers 105, 106 are washed away (for example, using a solvent), the metal on the top of the layer 106 is lifted-off and washed together with the layers 105, 106 below. After the lift-off, the deposited material (metal) remains only in the regions where it had a direct contact with the substrate 100 and/or metal structures 104' (thick metal depositions 108' shown in FIGS. 6B-6C). In other words, only the metallic material that was in the holes 107 having direct contact with the substrate and/or first metal structures stays.

As shown in FIGS. 6B-6C, the proposed metallization process for a graphene device guarantees metal contacts 108' of enough thickness to subsequently enable wire bonding with corresponding contacts in a socket, PCB, or the like, while maintaining thin metal structures 104' in contact with the graphene channel 101, which is thus not damaged.

The embodiment disclosed with reference to FIGS. 1A-6C refers to a two-probe device (a device requiring two metal contacts to be connected to two respective probes or contacts in a socket or the like). An example of such two-probe graphene device is a graphene photodetector or a graphene bolometer, as schematically shown in the top view of FIG. 6B. However, the proposed method of metallization of graphene devices can be extended to 3-probe devices or to N-probe devices. For example, FIGS. 7A-7D schematically show the two metallization steps for a 3-probe graphene device. An example of such 3-probe graphene device is a transistor, such as a GFET (graphene-based FET), or a triode, or a barrister, or a varactor, for example. In FIGS. 7A-7D a backgate 3-probe graphene device is shown (it is a GFET in which the gate contact is a back contact). In this case, three first metal structures 104' are deposited, and then three second thick metal contacts 108' are deposited. In another example, shown in FIGS. 8A-8D, an N-probe graphene device is depicted (N being a natural number). In the shown example, N=5. It is a 5-probe graphene device having five top contacts. In this case, five first metal structures 104' are deposited, and then five—5—second thick metal contacts 108' are deposited. Graphene devices requiring more than 3 three contacts or probes are, for example, devices for performing Transmission Line Measurement.

In embodiments of the disclosure, the die or wafer 10 comprises a plurality of graphene devices. For example, a sensor having a plurality of graphene devices can be implemented in a single die. In this case, N metal contacts (probes) are required, and N metal tracks (paths) connect the graphene devices with these contacts or probes. In an example, a sensor may be formed by a plurality of graphene transistors, GFET, located for example in a central area of the chip. Each graphene field-effect transistor has at least one graphene channel, a source contact, a drain contact and a gate contact, which is capacitively coupled to the graphene channel. In each GFET, the graphene layer, or a portion of graphene layer, is connected to two electrodes on opposite sides, namely the source and drain electrodes, which allow for current to be injected into and collected from the graphene channel. An additional contact or probe for the gate is also required.

In this text, the term "comprises" and its derivations (such as "comprising", etc.) should not be understood in an excluding sense, that is, these terms should not be interpreted as excluding the possibility that what is described and defined may include further elements, steps, etc.

In the context of the present disclosure, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

The disclosure is obviously not limited to the specific embodiment(s) described herein, but also encompasses any variations that may be considered by any person skilled in the art (for example, as regards the choice of materials, dimensions, components, configuration, etc.), within the general scope of the disclosure as defined in the claims.

The invention claimed is:

1. A method of metallizing a solid-state device comprising a substrate and at least one graphene channel disposed on the substrate, the method including the following steps:

applying a first metal deposition stage for depositing at least one first metallic structure, the at least one first metallic structure partially occupying the graphene layer and partially occupying the substrate, wherein a metal deposition technique which does not use plasma is used to deposit the at least one first metallic structure, wherein the first metal deposition stage is done as follows:

patterning on the graphene channel and substrate a geometry of the at least one first metallic structure to be deposited, and depositing the at least one first metallic structure on the applied pattern, and applying a second metal deposition stage for depositing at least one second metallic structure on a region of the at least one first metallic structure which is not deposited on the graphene channel.

2. The method of claim 1, wherein the patterning is done as follows:

depositing a mask layer on the graphene layer and on the substrate not covered by the graphene layer, and creating an inverse pattern in the mask layer by removing the mask layer in the regions where the metal is to be deposited, and leaving the mask layer in the regions to be protected.

3. The method of claim 1, wherein the at least one first metallic structure is deposited as follows:

applying a metallic layer, and lifting off the remaining mask layer, thus removing the metal deposited on the remaining mask layer and at least one metal structure remaining only in the regions where metal has a direct contact with the substrate and/or graphene layer.

4. The method of claim 1, wherein the first metal deposition stage is made by evaporation, electro-deposition, or electroplating.

5. The method of claim 1, wherein the at least one metallic structure deposited in the first metal deposition stage has a thickness in the range of between 0.1 and 1000 nanometers.

6. The method of claim 1, wherein the second metal deposition stage is done as follows:

patterning on the at least one first metallic structure and substrate the geometry of the at least one second metallic structure to be deposited, and depositing the at least one second metallic structure on the applied pattern.

7. The method of claim 6, wherein the patterning is done as follows:

depositing a first mask layer, depositing a second mask layer on the first mask layer, and creating an inverse pattern in the mask layers by removing the mask layers in the regions where the metal is to be deposited.

8. The method of claim 7, wherein the second mask layer has a higher developing rate than the first mask layer, which creates an undercut structure that eases lift-off.

9. The method of claim 7, wherein the at least one second metallic structure is deposited as follows:

applying a metallic layer, and lifting off the remaining mask layers, thus removing the metal deposited on the remaining mask layers, so that the at least one second metallic structure remains only in the regions where metal has a direct contact with the substrate and/or the at least one first metallic structure.

10. The method of claim 1, wherein the second metal deposition stage is made by one of the following metal deposition techniques: CVD, MOCVD, MOVPE, PECVD, ALD, PEALD, sputtering, such as DC diode sputtering, RF sputtering, magnetron sputtering, reactive sputtering, high-power impulse magnetron sputtering, ion beam deposition and electroplating.

11. The method of claim 1, wherein the at least one second metallic structure deposited in the second metal deposition stage has a thickness in the range of between 100 nanometers and 1000 microns.

12. A solid-state device comprising a substrate and at least one graphene channel disposed on the substrate, the solid-state device comprising:

at least one first metallic structure partially occupying the graphene layer and partially occupying the substrate, wherein the at least one first metallic structure has been deposited following a metal deposition technique which does not use plasma, wherein the at least one first metallic structure has been applied as follows:

patterning on the graphene channel and substrate a geometry of the at least one first metallic structure to be deposited, and depositing the at least one first metallic structure on the applied pattern;

at least one second metallic structure partially deposited on a region of the at least one first metallic structure which is not deposited on the graphene channel.

13. A method of packaging in a socket a die comprising at least one graphene-based solid-state device according to claim 12, the method comprising wire bonding each of the at least second metallic structures of the at least one graphene-based solid-state device to a corresponding contact of a socket.

14. A package comprising:

a die comprising at least one graphene-based solid-state device according to claim 12; and a socket, wherein each of the at least second metallic structures of the at least one graphene-based solid-state device is wire bonded to a corresponding contact of the socket.

* * * * *